(12) United States Patent
Hikmet et al.

(10) Patent No.: US 9,172,006 B2
(45) Date of Patent: Oct. 27, 2015

(54) LIGHTING APPARATUS

(75) Inventors: Rifat Ata Mustafa Hikmet, Eindhoven (NL); Jan Cornelis Kriege, Mierlo (NL); Johannes Franciscus Maria Cillessen, Deurne (NL); René Theodorus Wegh, Veldhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 316 days.

(21) Appl. No.: 13/583,236

(22) PCT Filed: Mar. 3, 2011

(86) PCT No.: PCT/IB2011/050910
§ 371 (c)(1),
(2), (4) Date: Sep. 7, 2012

(87) PCT Pub. No.: WO2011/114253
PCT Pub. Date: Sep. 22, 2011

(65) Prior Publication Data
US 2013/0044457 A1 Feb. 21, 2013

(30) Foreign Application Priority Data
Mar. 16, 2010 (EP) .................................. 10156580

(51) Int. Cl.
*F21V 9/16* (2006.01)
*H01L 33/50* (2010.01)
*F21V 3/04* (2006.01)

(52) U.S. Cl.
CPC .............. *H01L 33/50* (2013.01); *H01L 33/502* (2013.01); *F21V 3/0463* (2013.01); *F21V 9/16* (2013.01); *Y10T 29/49* (2015.01)

(58) Field of Classification Search
CPC ...... H01L 33/50; H01L 33/501; H01L 33/502; H01L 33/505; H01L 33/507; H01L 33/508; F21K 9/56; F21V 9/16; F21V 3/0463; F21V 3/0481; F21V 3/049
USPC .................... 362/84, 231; 313/501, 503, 504; 257/98, E33.061
See application file for complete search history.

(56) References Cited

U.S. PATENT DOCUMENTS 5,998,925 A * 12/1999 Shimizu et al. ............... 313/503
6,245,259 B1 * 6/2001 Hohn et al. ............... 252/301.36
(Continued)

FOREIGN PATENT DOCUMENTS

EP        1640429 A1    3/2006
JP     2002374006 A    12/2002
(Continued)

*Primary Examiner* — Alan Cariaso
(74) *Attorney, Agent, or Firm* — Yuliya Mathis

(57) ABSTRACT

The invention relates to a lighting apparatus comprising a conversion material (2) for converting primary light (4) into secondary light (5), wherein the conversion material (2) comprises converting photolummescent material (15), which degrades to non-converting photolummescent material over time when the conversion material (2) is illuminated by the primary light (4). The conversion material (2) is adapted such that, when the conversion material (2) is illuminated by the primary light (4), the relative decrease in concentration of the converting photolummescent material (15) within the conversion material (2) is larger than the relative decrease in intensity of the secondary light (5). This allows the lighting apparatus to provide an only slightly reduced absorbance of the primary light, even if a large part of the photolummescent material has been bleached, and thus a longer lifetime, with the same or a slightly reduced intensity of the secondary light.

15 Claims, 10 Drawing Sheets

(56) References Cited

U.S. PATENT DOCUMENTS

| | | |
|---|---|---|
| 7,202,599 B2 | 4/2007 | Yang |
| 7,294,861 B2 * | 11/2007 | Schardt et al. ............. 257/81 |
| 7,462,878 B2 | 12/2008 | Richter et al. |
| 8,337,029 B2 * | 12/2012 | Li ............................. 362/84 |
| 2004/0012027 A1 | 1/2004 | Keller et al. |
| 2008/0232085 A1 | 9/2008 | Luettgens et al. |
| 2008/0265749 A1 | 10/2008 | Bechtel et al. |
| 2009/0121190 A1 | 5/2009 | Parce et al. |
| 2009/0212308 A1 | 8/2009 | Brunner et al. |

FOREIGN PATENT DOCUMENTS

| | | |
|---|---|---|
| JP | 2003046136 A | 2/2003 |
| JP | 2006135225 A | 5/2006 |
| JP | 2007324337 A | 12/2007 |
| JP | 2008124117 A | 5/2008 |
| JP | 2009140835 A | 6/2009 |
| WO | 0169692 A1 | 9/2001 |
| WO | 2005083036 A1 | 9/2005 |
| WO | 2008065567 A1 | 6/2008 |
| WO | 2009020547 A2 | 2/2009 |
| WO | 2009136351 A1 | 11/2009 |

* cited by examiner

LIGHTING APPARATUS

FIELD OF THE INVENTION

The invention relates to a lighting apparatus and a lighting method. The invention relates further to a manufacturing method for manufacturing the lighting apparatus.

BACKGROUND OF THE INVENTION

U.S. Pat. No. 7,462,878 B2 discloses a light-emitting diode chip comprising a semiconductor layer sequence suitable for emitting primary electromagnetic radiation and further comprising a converter layer that is applied to at least one main face of the semiconductor layer sequence and comprises at least one phosphor suitable for converting a portion of the primary radiation into secondary radiation. At least a portion of the secondary radiation and at least a portion of the unconverted primary radiation overlap to form a mixed radiation with a resulting color space. The converter layer is purposefully structured to adjust a dependence of the resulting color space on viewing angle. The at least one phosphor can be an organic phosphor.

SUMMARY OF THE INVENTION

It is an object of the present invention to provide a lighting apparatus, lighting method and manufacturing method for manufacturing the lighting apparatus, wherein the lifetime of the lighting apparatus can be increased.

In a first aspect of the present invention a lighting apparatus is presented, wherein the lighting apparatus comprises:

a conversion material for converting primary light into secondary light, wherein the conversion material comprises converting photoluminescent material, which degrades to non-converting photoluminescent material over time when the conversion material is illuminated by the primary light, a primary light source for emitting primary light for being directed to the conversion material for generating secondary light, wherein the conversion material is adapted such that, when the conversion material is illuminated by the primary light, the relative decrease in concentration of the converting photoluminescent material within the conversion material is larger than the relative decrease in intensity of the secondary light.

In the prior art the degradation of the photoluminescent material leads to a substantial loss of absorbance of the primary light by the photoluminescent material. By adapting the conversion material such that, when the conversion material is illuminated by the primary light, the relative decrease in concentration of the converting photoluminescent material within the conversion material is larger than the relative decrease in the intensity of the secondary light, the absorbance of the primary light is only slightly reduced, even if a large part of the photoluminescent material has been bleached. The lighting apparatus can therefore be used over a longer time, with the same or a slightly reduced intensity of the secondary light. This can increase the lifetime of the lighting apparatus.

If, for example, only a first part of the primary light is directed to the converting photoluminescent material for generating secondary light, wherein a second part of the primary light is not directed to the converting photoluminescent material, the second part of the primary light and the secondary light can be mixed for generating mixed light having a desired color temperature. Since the conversion material is adapted such that, when the conversion material is illuminated by the primary light, the relative decrease in concentration of the converting photoluminescent material within the conversion material is larger than the relative decrease in intensity of secondary light, the color temperature of the mixed light will substantially not be modified or only slightly modified, if the conversion material is illuminated by the primary light.

The relative decrease in concentration of the converting photoluminescent material within the conversion material is preferentially defined as the difference of the converting photoluminescent material within the conversion material at a first time and at a second time divided by the concentration of the converting photoluminescent material within the conversion material at the first time. The first time is preferentially the time at which the illumination of the conversion material with the primary light starts. For example, the first time can be the time at which the conversion material is firstly illuminated with the primary light, after the lighting apparatus has been manufactured. The relative decrease in intensity of the secondary light is preferentially defined as the difference between the intensities of the secondary light at the first time and at the second time divided by the intensity of the secondary light at the first time. The relative decrease in concentration of the converting photoluminescent material within the conversion material is preferentially larger than the relative decrease in intensity of the secondary light for all second times being later than the first time.

Preferentially, at least one of the concentration of the converting photoluminescent material within the conversion material and the length of the path of the primary light within the conversion material is adapted such that, when the conversion material is illuminated by the primary light, the relative decrease in concentration of the converting photoluminescent material within the conversion material is larger than the relative decrease in intensity of the secondary light. In particular, the conversion material can form a layer comprising organic phosphor molecules as the converting photoluminescent material, wherein the thickness of the layer and the concentration of the organic phosphor molecules are adapted such that the relative decrease in intensity of the secondary light is less than 10% during a required lifetime under operating conditions. If the lighting apparatus is adapted to provide mixed light as described above, the thickness of the layer and the concentration of the organic phosphor molecules are preferentially adapted such that, for example, a shift of the color temperature during a required lifetime under operating conditions is smaller than 300 K, or a shift in the color space during a required lifetime under operating conditions is smaller than 5 standard deviation of color matching (SDCM).

A desired lifetime is, for example, 1000 hours or larger, 5000 hours or larger, or 10000 hours or larger. Under operating conditions the temperature of the conversion material is, for example, 60° Celsius or larger, 100° Celsius or larger, or 120° Celsius or larger, and the intensity of the primary light is, for example, 0.1 W/cm$^2$ or larger, 1 W/cm$^2$ or larger, or 2 W/cm$^2$ or larger. Preferentially, the operating conditions are defined by 120° Celsius for the conversion material and an intensity of the primary light of 2 W/cm$^2$.

The lighting apparatus is preferentially adapted to be used in traffic lights, automotive lighting, horticulture lighting et cetera. The lighting apparatus is preferentially adapted to generate red and/or amber secondary light. The lighting apparatus can also be adapted to generate another color or white light, wherein green to red emitting converting photoluminescent material is illuminated by the primary light for generating secondary light having different colors and which mix for generating white light. In particular, only a first part of the primary light can be directed to the converting luminescent material for generating secondary light having one or several colors and which mix with a second part of the primary light, which has not been directed to the converting photoluminescent material, for generating white light or any other desired color. For example, the primary light can be blue light and the secondary light can be red light for generating a purple color.

The lighting apparatus is preferentially adapted such that the primary light, in particular, the first part of the primary light, which is directed to the converting photoluminescent material, is substantially fully converted into the secondary light.

The converting photoluminescent material can degrade over time, if exposed to heat or light, in particular, to the primary light. The converting photoluminescent material is preferentially a phosphorescent material or a fluorescent material. In particular, the converting photoluminescent material preferentially comprises organic phosphor molecules which show only bleaching as result of a photochemical reaction, i.e. irradiation should primarily lead to bleaching. The organic phosphor molecules are preferentially organic dyes such as perylene derivatives.

It is preferred that the conversion material is adapted such that, if the relative decrease in concentration of the converting photoluminescent material is equal to or smaller than 90 percent, the relative decrease in intensity of the secondary light is smaller than 10 percent, further preferred smaller than 5 percent and even further preferred smaller than 3 percent. In a further preferred embodiment, the conversion material is adapted such that, if the relative decrease in concentration of the converting photoluminescent material is equal to or smaller than 90 percent, the relative decrease in intensity of the secondary light is smaller than 1 percent.

In an embodiment, the converting photoluminescent material, i.e. the photoluminescent dye, is provided in a layer with a concentration and with a thickness such that the transmission of the primary light is about $10^{-8}$ percent which corresponds to an absorbance of 10, before degradation. After a degradation of 90 percent of the converting photoluminescent material, the absorbance becomes preferentially 1 which corresponds to a transmission of 10 percent. The absorption of the primary light and, thus, the emission of the secondary light is therefore only slightly altered. If it is assumed that the end of the lifetime is at about 90 percent degradation of the photoluminescent material, the absorbance of the primary light has been decreased from 10 to 1, i.e. still almost all of the primary light is absorbed by the converting photoluminescent material.

It can generally be assumed that the concentration C(t) of the converting photoluminescent material, decays exponentially according to following equation:

$$C(t)=C_0 e^{-\alpha t} \quad (1)$$

wherein $C_0$ indicates the concentration of the converting photoluminescent material at a first time at which the illumination of the converting photoluminescent material by the primary light starts and $\alpha$ is the decay constant. If the lifetime is defined as the time at which a relative decrease in intensity of the secondary light of 10 percent has been reached, the lifetime of a prior art lighting apparatus is about $\ln(C_0/C(t))/\alpha=\ln(1/0.9)/\alpha$. In a preferred embodiment of the invention, a relative decrease in intensity of the secondary light of 10 percent is realized at a relative decrease in concentration of the converting photoluminescent material within the conversion material of 90 percent. The lifetime can therefore be defined by $\ln(C_0/C)/\alpha=10/0.1)/\alpha$. In this example, the lifetime is therefore increased by a factor of $\ln(1/0.1)/\ln(1/0.9)$ =21.85 by increasing the absorbance of the conversion layer by a factor of 10, wherein the absorbance is preferentially defined by the product of the thickness of the layer, the concentration of the converting photoluminescent material in the layer and the extinction coefficient of the converting photoluminescent material.

It is preferred that the converting photoluminescent material comprises an organic converting photoluminescent material and/or quantum dots. The organic converting photoluminescent material is preferentially an organic phosphor. Organic phosphor has several advantages as compared with inorganic phosphor. The position and the bandwidth of the luminescent spectrum can be designed to be anywhere in the visible range to obtain high efficacy. Furthermore, quantum yield of the color conversion can be very high, and organic phosphors show high transparency, i.e. reflection or scattering of the primary light is reduced, in particular, eliminated, thereby further improving the system efficiency. Moreover, because of its organic and sustainable nature, organic phosphors can be several orders of magnitude cheaper than inorganic phosphors. Also if the converting photoluminescent material comprises quantum dots, the position and the bandwidth of the luminescent spectrum can be designed to be anywhere in the visible range to obtain high efficacy, in particular, by tuning the size of the quantum dots.

It is also preferred that the primary light source is a light emitting diode. In particular, the primary light source is a light emitting diode generating blue primary light. Blue primary light can generally be converted into any other color in the visible range, with minimal loss of energy, the so-called Stokes loss. Blue light emitting diodes are very efficient. If the lighting apparatus is adapted to generate mixed light being a mixture of primary light, which has not been absorbed by the converting photoluminescent material, and secondary light, and if the lighting apparatus should output white mixed light, the blue component of the white mixed light can be provided by the blue light emitting diode. In another embodiment, the light emitting diode can also be adapted to generate near ultraviolet primary light. In this case, preferentially also the blue component of desired white light is generated by converting the near ultraviolet primary light to blue secondary light.

It is further preferred that the conversion material comprises particles for scattering the secondary light for reducing waveguiding effects. The reduction of waveguiding effects can improve an outcoupling of the secondary light out of the conversion material. In preferred embodiments of the lighting apparatus, the conversion material forms a flat conversion layer placed on an exit window of the lighting apparatus, wherein a preferred light exit direction is substantially perpendicular to the plane in which the conversion layer is located. Especially in this case a reduction of waveguiding effects leads to a reduction of self absorption losses and also reduces the probability that a fraction of the secondary light leaves the lighting apparatus from edges of the conversion layer, thereby increasing the efficiency of the lighting apparatus.

In a preferred embodiment, the conversion material forms a layer comprising a decoupling outer surface for coupling the secondary light out. The decoupling surface can also be adapted to reduce waveguiding effects.

It is further preferred that the conversion material forms a layer comprising a surface being optically coupled to a scattering surface for reducing waveguiding effects.

It is further preferred that the lighting apparatus is adapted such that primary light, which has not been absorbed by the converting photoluminescent material, and secondary light are mixed for generating mixed light which is output by the lighting apparatus. This can lead to a color of the mixed light which is substantially independent of an angle under which the mixed light leaves the lighting apparatus.

It is also preferred that the conversion material forms a layer comprising an outer decoupling surface for decoupling the secondary light from the layer, wherein the primary light source and the layer are arranged such that the primary light illuminates the layer in a direction being transverse or parallel to the outer decoupling surface. For example, the outer decoupling surface can be a diffuse surface for decoupling the secondary light by diffusion. The lighting apparatus preferentially comprises a collimator for collimating the primary light for being directed transverse or parallel to the outer decoupling surface.

The lighting apparatus can comprise a shield for shielding the converting photoluminescent material from environmental light. This suppresses emission of secondary light being induced by the environmental light. The shield can be adapted to shield sunlight or artificial light like light from other cars, if the lighting apparatus is used in a car. The shield comprises preferentially a filter being adapted for absorbing and/or reflecting light within the absorbance range of the converting photoluminescent material. The filter can be placed on an outer surface of a layer of the converting photoluminescent material.

It is further preferred that the lighting apparatus comprises a reflective chamber comprising a reflective inner surface for directing the primary light to at least one of a photoluminescence region in which the conversion material is located or an exit window of the reflective chamber.

The converting photoluminescent material can be arranged in a pattern. Preferentially, the pattern comprises at least one first area with the converting photoluminescent material and at least one second area without the converting photoluminescent material. For example, the lighting apparatus can comprise a light exit window, wherein the converting photoluminescent material does not cover the complete light exit window, but only a part of this window, in particular, in certain areas of the light exit window the converting photoluminescent material can be present, wherein in other areas of the light exit window the converting photoluminescent material is not present. The area of the light exit window, in which the converting photoluminescent material is not present, is preferentially transparent to the primary light. Thus, primary light and secondary light can leave the exit window and mix for producing mixed light comprising a mixed color. The ratio of areas with and without the converting photoluminescent material determines the color temperature of the lighting apparatus.

It is preferred that the conversion material comprises a composite including two phases, wherein the converting photoluminescent material is present in one of the two phases only for arranging the converting photoluminescent material in a pattern. The other of the two phases is preferentially transparent, in particular, completely transparent, to the primary light. For example, converting photoluminescent material can be molecularly dispersed in polymer particles. The polymer particles are then dispersed into another polymer for producing the composite. It is also possible to produce the composite by mixing two incompatible polymers, wherein the converting photoluminescent material is dissolved in only one of the polymers. The phase, which does not comprise the converting photoluminescent material, can lead to volume scattering of primary light, which has not been absorbed by the converting photoluminescent material, and the secondary light for improving the mixture of the light and for reducing waveguiding effects.

The lighting apparatus can comprise different kinds of converting photoluminescent material providing secondary light having different colors. The different kinds of converting photoluminescent material can be mixed, wherein the mixture is provided at the same region of the lighting apparatus, or the different kinds of converting photoluminescent material can be arranged in separate regions of the lighting apparatus. The regions of the lighting apparatus can be provided on an exit window of the lighting apparatus.

In a further aspect of the present invention a manufacturing method for manufacturing a lighting apparatus is presented, wherein the manufacturing method comprises:

providing conversion material for converting primary light into secondary light, wherein the conversion material comprises converting photoluminescent material, which degrades to non-converting material over time when the conversion material is illuminated by the primary light, adapting the conversion material such that, when the conversion material is illuminated by the primary light, the relative decrease in concentration of the converting photoluminescent material within the conversion material is larger than the relative decrease in intensity of the secondary light providing a primary light source for emitting the primary light, arranging the conversion material and the primary light source such that the primary light is directable to the conversion material for generating secondary light.

In a further aspect of the present invention a lighting method is presented, wherein primary light is emitted by a primary light source and directed to conversion material comprising converting photoluminescent material, which degrades to non-converting photoluminescent material over time when the conversion material is illuminated by the primary light, for generating secondary light, wherein the conversion material is adapted such that, when the conversion material is illuminated by the primary light, the relative decrease in concentration of the converting photoluminescent material within the conversion material is larger than the relative decrease in intensity of the secondary light.

It shall be understood that the lighting apparatus of claim 1, the manufacturing method of claim 14 and the lighting method of claim 15 have similar and/or identical preferred embodiments, in particular, as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
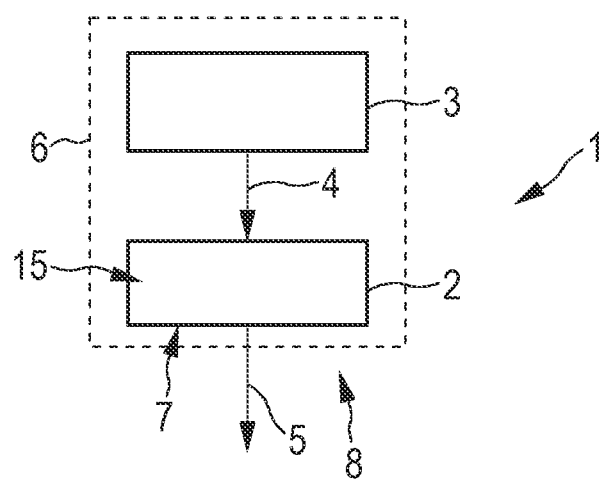
FIG. 1 shows schematically and exemplarily a first embodiment of a lighting apparatus.

FIG. 1 shows schematically and exemplarily a lighting apparatus 1 comprising a conversion material 2, for connecting primary light into secondary light. The conversion material 2 includes a converting photoluminescent material 15 which degrades over time. The lighting apparatus 1 further comprises a primary light source 3 for emitting primary light 4 for being directed to the converting photoluminescent material 15 for generating secondary light 5. The conversion material 2 and the primary light source 3 are located within a casing 6 having an exit window 8 for allowing the secondary light 5 to leave the casing 6. The conversion material 2 is adapted such that after 90 percent degradation of the converting photoluminescent material 15 the conversion material 15 absorbs more than 90 percent of the primary light 4. The conversion material 2 is provided in a layer, wherein at least one of the concentration of the converting photoluminescent material 15 in the layer and the length of the paths of the primary light 4 within the layer, in particular, the thickness of the layer, is adapted such that after 90 percent degradation of the converting photoluminescent material the conversion material absorbs more than 90 percent of the primary light. The layer preferentially comprises organic phosphor molecules as the converting photoluminescent material, wherein the thickness of the layer and the concentration of the organic phosphor molecules are preferentially adapted such that the decrease in intensity of secondary light is less than 10 percent in 5000 hours of operating the lighting apparatus 1 at 100° C. with an intensity of primary light of 2 W/cm².

The converting photoluminescent material 2 degrades overtime, if exposed to heat or light, in particular, to the primary light 4. The converting photoluminescent material comprises organic phosphor molecules like perylene derivatives of organic dyes. These organic phosphor molecules show only bleaching as result of a thermo chemical reaction, i.e. irradiation primarily leads to bleaching and not to a quantum efficiency decrease and not to a formation of additional absorption centers. In addition or alternatively, the converting photoluminescent material can comprise quantum dots.

The primary light source 3 is a light emitting diode which preferentially emits blue primary light 4. The lighting apparatus is preferentially adapted to generate red and/or amber secondary light. The lighting apparatus can also be adapted to generate another color or white light, wherein green to red emitting converting photoluminescent material is illuminated by the primary light for generating secondary light having different colors and which mix for generating white light.

The conversion material 2 comprises particles for scattering the secondary light generated within the conversion material 2. These particles reduce waveguiding effects. Moreover, the conversion material forming the layer comprises a decoupling outer surface 7 for coupling the secondary light out. The decoupling outer surface 7 is also adapted to reduce waveguiding effects.

Figure 2:
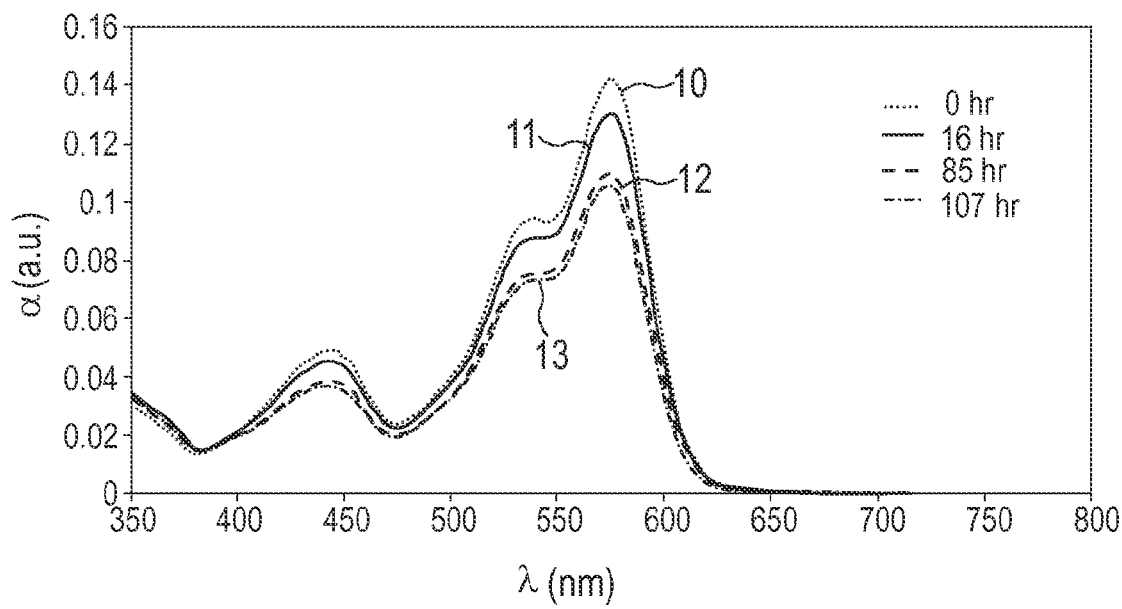
FIG. 2 shows exemplarily several absorption spectra of organic phosphor molecules.

Organic and quantum dot phosphor have a low photo chemical stability. It is observed that organic molecules bleach, if exposed to light as exemplarily shown in FIG. 2. FIG. 2 shows absorption spectra of the photoluminescent material after various exposure times to blue primary light, i.e. for different bleaching times. The spectrum indicated by reference number 10 corresponds to no bleaching, the spectrum indicated by reference number 11 corresponds to a bleaching of 16 hours, the spectrum indicated by reference number 12 corresponds a bleaching of 85 hours and the spectrum indicated by reference number 13 corresponds to a bleaching time of 107 hours.

Figure 3:
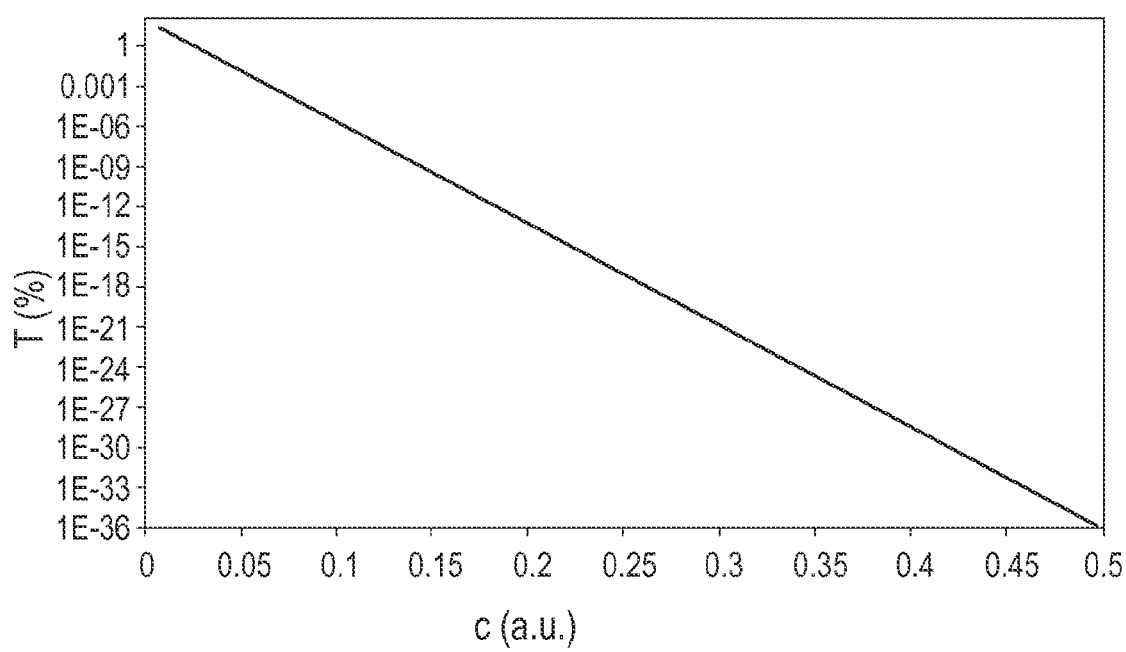
FIG. 3 shows exemplarily the transmission of a conversion layer of the lighting apparatus with respect to primary light depending on a concentration of an organic phosphor within the conversion layer.

The lighting apparatus is preferentially adapted to convert primary light, which is preferentially light of a light emitting diode, substantially completely into secondary light having another color with a minimum leakage of the primary light. For this purpose a conversion layer formed by the conversion material is preferentially used having a thickness and a concentration of the converting photoluminescent material such that more than, for example, 99 percent of the primary light is converted by the converting photoluminescent material which can also be regarded as a luminescent dye. FIG. 3 shows schematically and exemplarily the transmission of the primary light having, for example, a wavelength of 450 nm depending on the dye concentration within the conversion layer which has, in this example, a thickness of 1 mm. FIG. 3 shows that after a tenfold decrease in the absorbance there is still enough absorbance so that there is a small leakage of primary light through the conversion layer. In FIG. 3 it can be seen that, if, for example, it is assumed that the initial concentration of the converting photoluminescent material is 0.45 percent and that after degradation the concentration goes down to 0.045 percent, the transmission of the primary light is still smaller than 1 percent. This means that after a relative decrease in concentration of the converting photoluminescent material within the conversion material of 90 percent, still more than 99 percent of the primary light is absorbed by the converting photoluminescent material. The reduction in intensity of the secondary light is therefore relatively small compared to the initial intensity of the secondary light before degradation.

Figure 4:
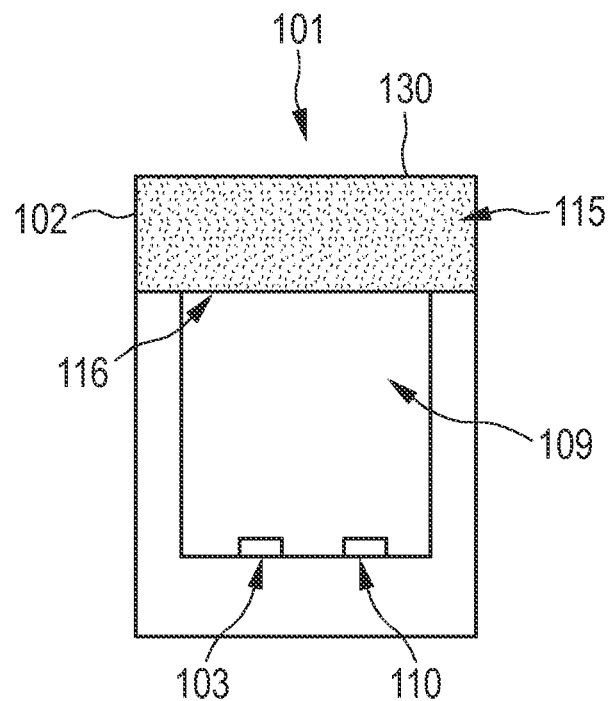
FIGS. 4 to 6 show schematically and exemplarily a further embodiment of a lighting apparatus.
Figure 5:
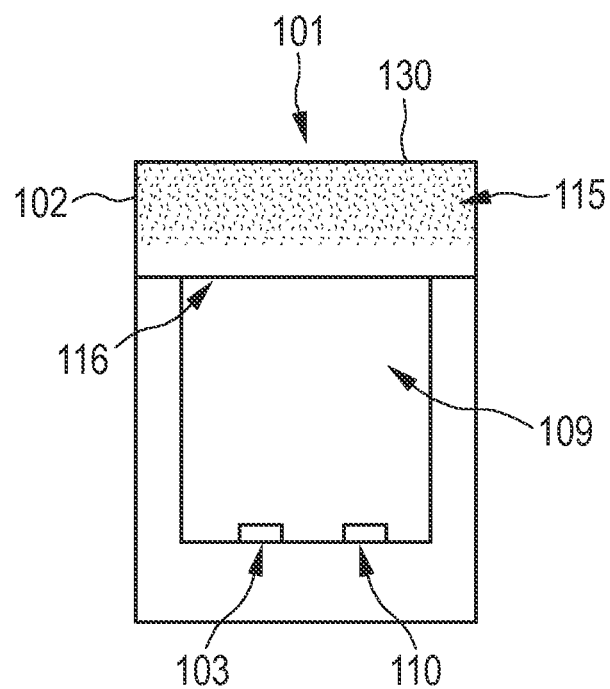
Figure 6:
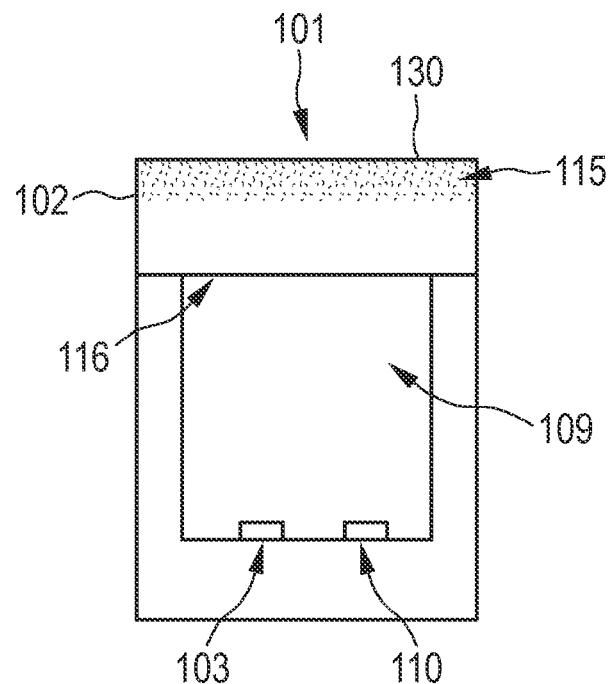

FIGS. 4 to 6 show a further embodiment of a lighting apparatus. The lighting apparatus 101 comprises a conversion material 102 for converting primary light into secondary light, wherein the conversion material 102 comprises converting photoluminescent material 115 which degrades over time. The converting photoluminescent material comprises preferentially an organic phosphor and/or quantum dots. The lighting apparatus comprises primary light sources 103 and 110 being light emitting diodes. The light emitting diodes emit primary light for being directed to the converting photoluminescent material 115 for generating secondary light.

The conversion material 102 is preferentially adapted such that, if the relative decrease in concentration of the converting photoluminescent material 115 is equal to or smaller than 90 percent, the relative decrease in intensity of the secondary light is smaller than 10 percent. The lighting apparatus 101 comprises a reflective chamber 109 comprising a reflective inner surface for directing the primary light to a photoluminescence region 116 of the reflective chamber 109 in which the conversion material 102 is located. The lighting apparatus 101 comprises an exit window 130 from which the light exits the device. The exit window 130 can be formed by the conversion layer 102 or the conversion layer 102 can be located on the exit window 130. If the conversion layer 102 is illuminated by the primary light, the converting photoluminescent material is degraded, i.e. bleached, as schematically indicated by an increasing white region in FIGS. 4 to 6. The conversion layer is preferentially adapted such that less than 20 percent of the secondary light is reabsorbed in the conversion layer. In order to reduce this self absorption, conversion materials are preferred showing large Stokes shifts, wherein a Stokes shift is preferentially defined as the difference between positions of the band maxima of the absorption and emission spectra of the same electronic transition. Stokes shifts more than 50 nm are preferred. For this purpose luminescent molecules showing resonant energy transfer can be used in the conversion layer.

Figure 7:
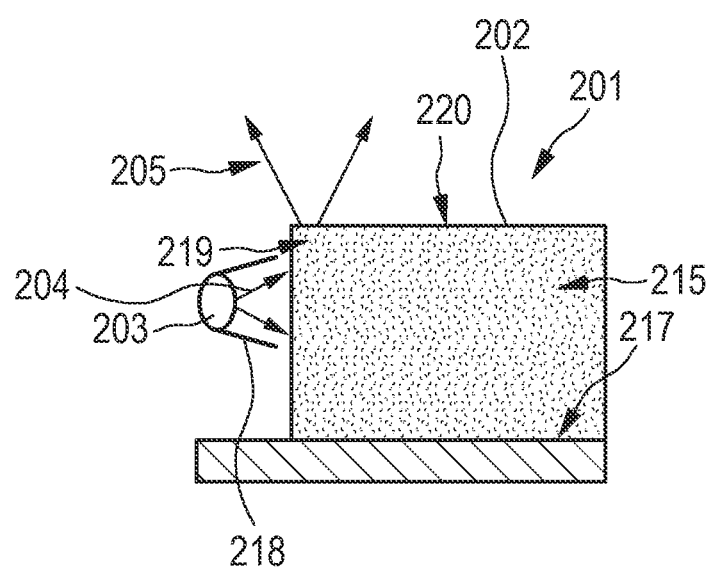
FIGS. 7 to 9 show schematically and exemplarily a further embodiment of the lighting apparatus.
Figure 8:
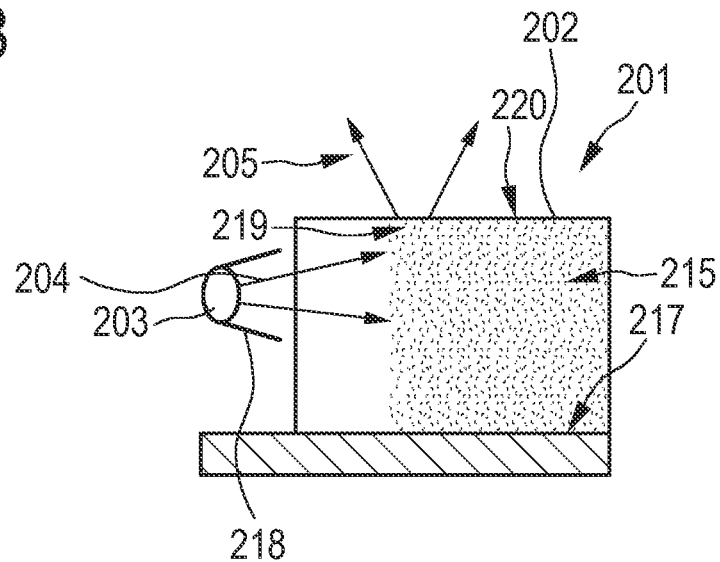
Figure 9:
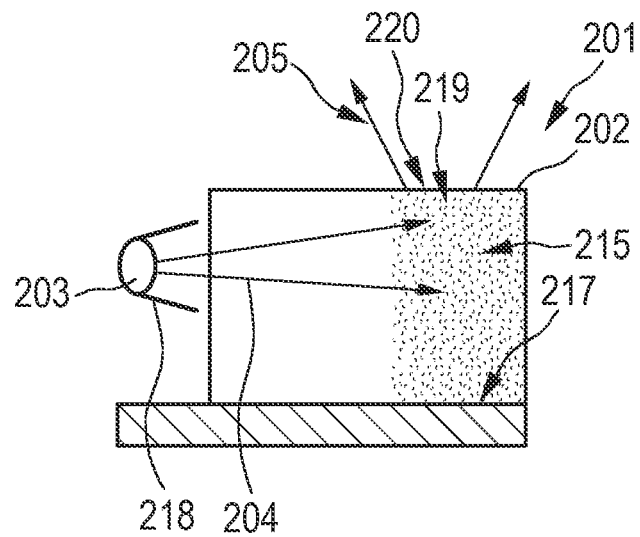

FIGS. 7 to 9 show a further embodiment of a lighting apparatus. The lighting apparatus 201 comprises a conversion material 202 for converting primary light 204 into secondary light 205, wherein the conversion material 202 comprises converting photoluminescent material 215 which degrades over time. The converting photoluminescent material 215 preferentially comprises an organic phosphor and/or quantum dots. The lighting apparatus 201 comprises a primary light source 203 being a light emitting diode for emitting the primary light 204 for being directed to the converting photoluminescent material 215 for generating the secondary light 205. Also in this embodiment the conversion material 202 is adapted such that, if the relative decrease in concentration of the converting photoluminescent material is equal to or smaller than 90 percent, the relative decrease in intensity of the secondary light is smaller than 10 percent. The lighting apparatus 202 comprises an inner reflecting surface 217 and an opposite outer decoupling surface 220 for decoupling the secondary light 205 from a conversion layer formed by the conversion material 202 such that the secondary light 205 leaves the lighting apparatus substantially through the decoupling surface 220. Additionally, the lighting apparatus 201 may comprise a collimator 218 for collimating the primary light 204. In particular, in FIGS. 7 to 9 the primary light of the light emitting diode 203 is coupled to the conversion layer from the left side and collimated to illuminate in a direction pointing from the left side to the right side in FIGS. 7 to 9. As a result of bleaching the position 219 of emission is altered, wherein preferentially a complete conversion of the primary light into secondary light remains even in FIG. 9. The bleaching is indicated by the increasing white area in FIGS. 8 and 9.

The primary light source 203 and the conversion layer 202 are arranged such that the primary light 204 traverses the conversion layer 202 in a direction being substantially parallel to the outer decoupling surface 220. The outer decoupling surface 220 can be a diffuse surface for decoupling the secondary light 205 by diffusion.

Figure 10:
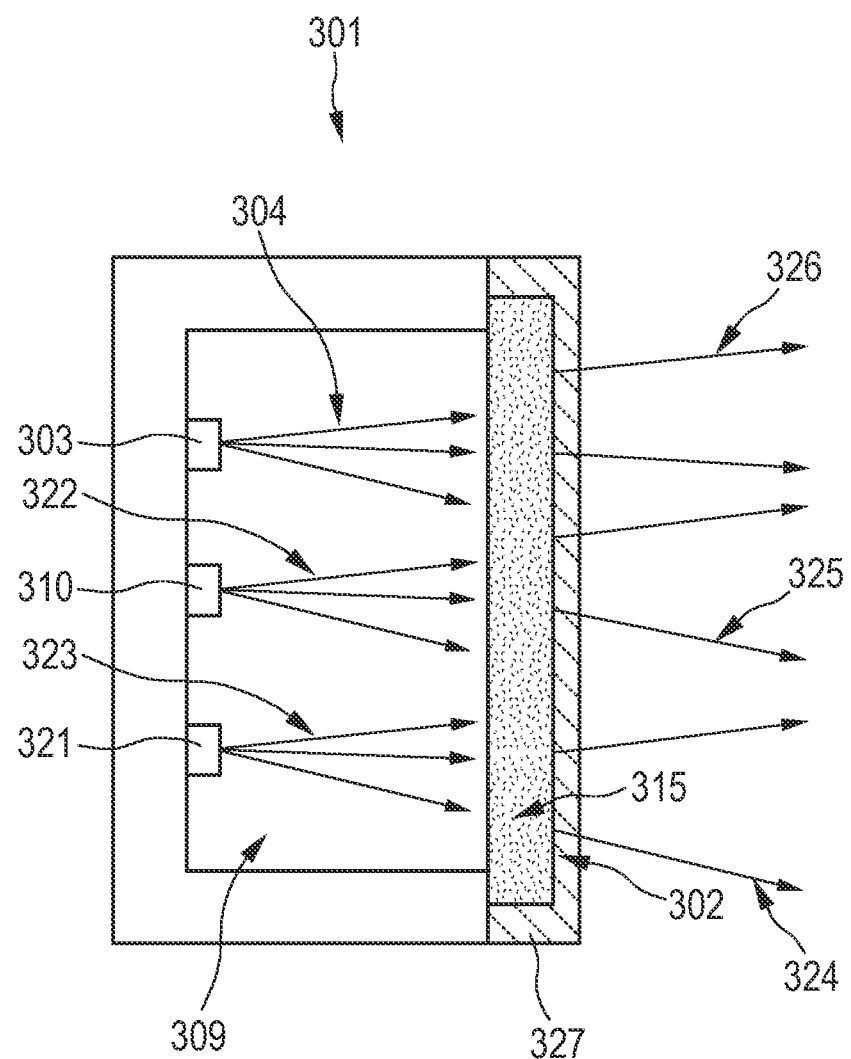
FIG. 10 shows schematically and exemplarily a further embodiment of a lighting apparatus.

FIG. 10 shows a further embodiment of a lighting apparatus. The lighting apparatus 301 comprises a conversion material 302 for converting primary light 304, 322, 323 into the secondary light 326, 325, 324. The conversion material 302 comprises converting photoluminescent material 315 which degrades over time. Also in this embodiment the converting photoluminescent material 315 preferentially comprises an organic phosphor and/or quantum dots. The lighting apparatus comprises primary light sources 303, 310, 321 being light emitting diodes for emitting the primary light 304, 322, 323. The primary light 304, 322, 323 is directed to the converting photoluminescent material 315 for generating the secondary light 326, 325, 324. Also in this embodiment the conversion material 302 is adapted such that, if the relative decrease in concentration of the converting photoluminescent material 315 is equal to or smaller than 90 percent, the relative decrease in intensity of the secondary light is smaller than 10 percent. The lighting apparatus 301 comprises a reflective chamber 309 for mixing the primary light 304, 322, 323 and for directing the mixed primary light to the conversion material 302. A side element of the reflective chamber 309 comprises the conversion material 302, wherein the outside of the conversion material 302, which faces the outside of the lighting apparatus 301, is shielded by a shield 327. The shield 327 is adapted to shield the conversion material 302 from environmental light. This suppresses emission of secondary light being induced by the environmental light. The shield can be adapted to shield sun light or artificial light like light from other cars, if the lighting apparatus is used in a car. The shield 327 comprises preferentially a filter being adapted for absorbing and/or reflecting light within the absorbance range of the converting photoluminescent material 315.

Figure 11:
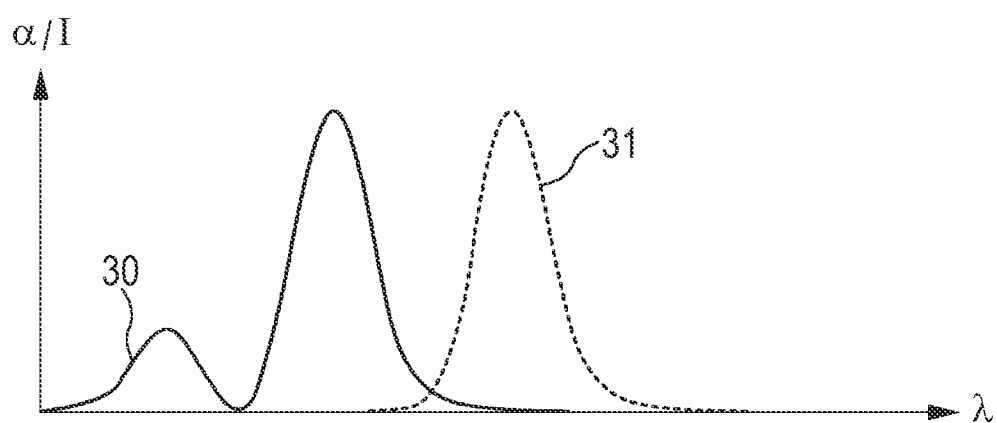
FIG. 11 shows exemplarily absorption and emission spectra of phosphor material.
Figure 12:
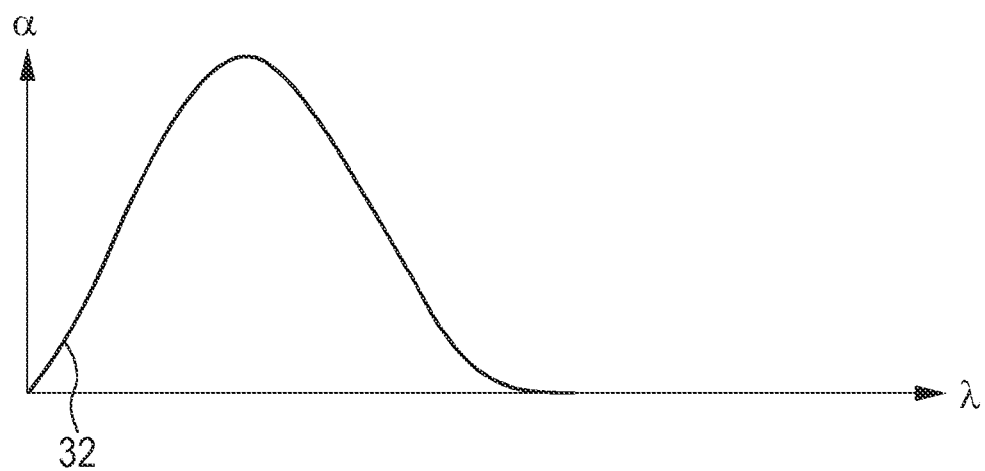
FIG. 12 shows exemplarily an absorption spectrum of a filter of a shield for shielding environmental light.

FIG. 11 shows schematically and exemplarily an absorption spectrum 30 and an emission spectrum 31 of the converting photoluminescent material. Given these spectra, the absorption spectrum of the filter of the shield 327 can be described by the absorption spectrum 32 shown in FIG. 12.

Figure 19:
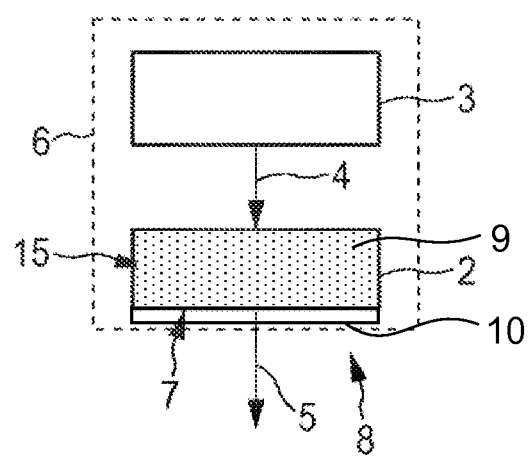
FIG. 19 shows schematically and exemplarily an embodiment of a lighting apparatus including scattering particles and a scattering surface.

The conversion material described in the embodiments forms preferentially a layer. This layer can comprise a decoupling outer surface for coupling the secondary light out. The decoupling surface can also be adapted to reduce waveguiding effects. In addition or alternatively, as illustrated in FIG. 19, a surface 7 of the layer can also be optically coupled to a scattering surface 10 for reducing waveguiding effects. The conversion material can also comprise particles 9 for scattering the secondary light for reducing waveguiding effects.

In FIGS. 1 and 4 to 10 the conversion material forms a conversion layer, wherein the converting photoluminescent material seems to be distributed continuously and homogenously. However, the converting photoluminescent material can also be arranged in a pattern. The area of the lighting apparatus, through which the secondary light and optionally also the primary light, which has not been directed to the converting photoluminescent material, can leave the lighting apparatus can be regarded as a light exit window. In FIGS. 1 and 4 to 10 this light exit window is covered by the conversion material. The conversion material can be adapted such that the converting photoluminescent material does not cover the complete light exit window, but only a part of this window. In particular, in certain areas of the light exit window the converting photoluminescent material can be present, wherein in other areas of the light exit window the converting photoluminescent material is not present. The ratio of areas with and without the converting photoluminescent material determines the color temperature of the lighting apparatus. Such a light exit window can be produced by coating a patterned converting photoluminescent material on a substrate.

Figure 13:
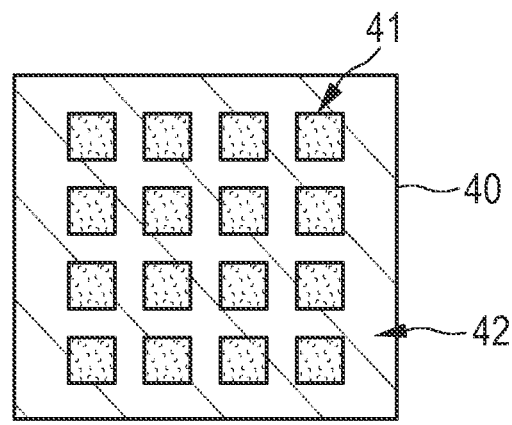
FIG. 13 shows schematically and exemplarily a pattern of organic phosphor.
Figure 14:
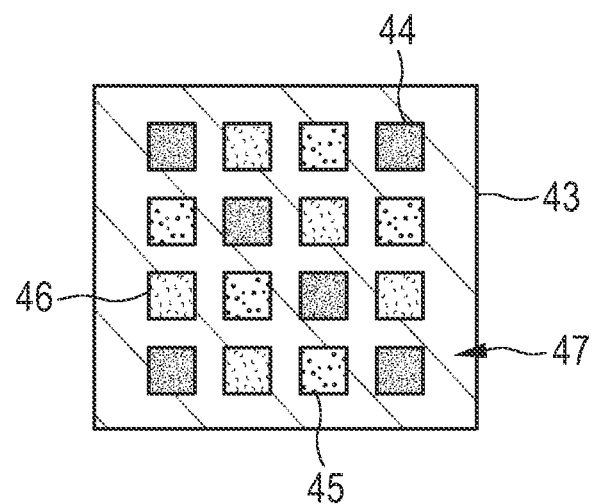
FIG. 14 shows schematically and exemplarily a pattern of organic phosphor being adapted for emitting different colors.

FIG. 13 shows schematically and exemplarily such a substrate 40 with areas 41 comprising organic phosphor and areas 42, in which the organic phosphor is not present. The substrate is transparent to the primary light such that the resulting light of the lighting apparatus is a mixture of the secondary light generated by the organic phosphor and the primary light which has traversed the substrate 40 without traversing the organic phosphor. The different areas comprising organic phosphor can be provided with different kinds of organic phosphor emitting different wavelengths as schematically and exemplarily shown in FIG. 14. In FIG. 14 on a transparent substrate 43 three different kinds of organic phosphor 44, 45, 46 are coated for generating different colors. For example, the organic phosphors 44 can generate red light, the organic phosphors 45 can generate green light and the organic phosphors 46 can generate yellow light. The different colors of this secondary light mix with the primary light which traverses the substrate in the areas 47, which are not covered by the organic phosphors 44, 45, 46.

Figure 15:
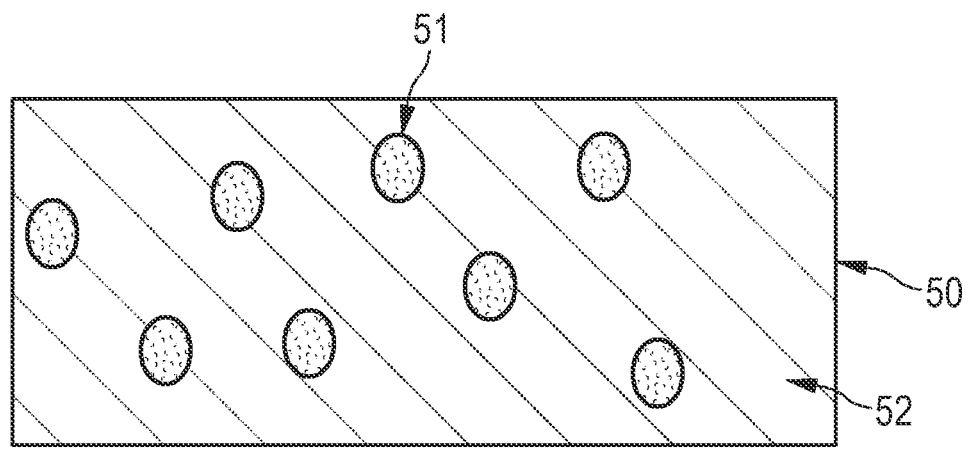
FIG. 15 shows a composite of a first phase comprising organic phosphor and a second phase being transparent to primary light.

The conversion material described above with reference to FIGS. 1 and 4 to 10 can be a composite including two phases wherein the converting photoluminescent material is present in one of the two phases only for arranging the converting photoluminescent material in a pattern. The other of the two phases is preferentially transparent, in particular, completely transparent, to the primary light. For example, converting photoluminescent material can be molecularly dispersed in polymer particles, wherein the polymer particles are then dispersed into another polymer for producing the composite. It is also possible to produce the composite by mixing two incompatible polymers, wherein the converting photoluminescent material is dissolved in only one of the polymers. FIG. 15 shows schematically a composite 50 of a first phase 51 comprising the organic phosphor and a second phase 52 forming a matrix being transparent to the primary light. The first phase 51 with the organic phosphor forms several areas within the transparent phase 52, wherein different areas can emit the same color or different colors.

Figure 16:
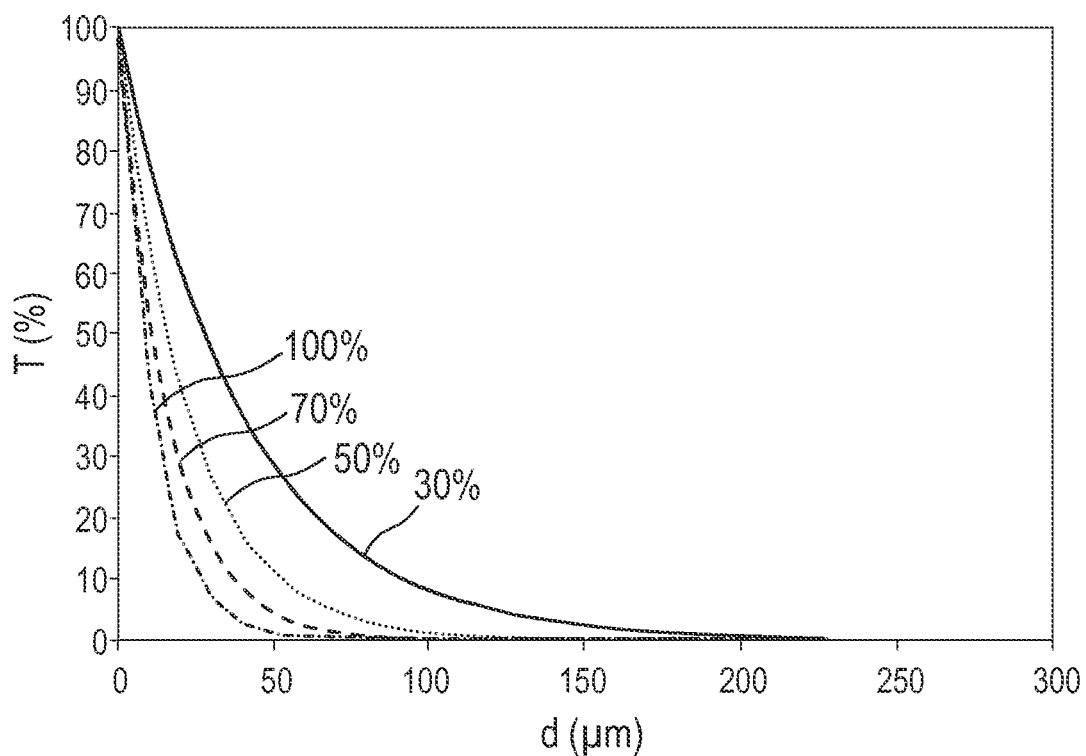
FIG. 16 shows transmission of different conversion layers having different concentrations of absorbing phosphor as a function of the thickness of the conversion layer.

FIG. 16 shows schematically and exemplarily the transmission of primary light having a wavelength of 450 nm as a function of the thickness d of the conversion layer having a concentration of a photoluminescent material of 0.5 percent. Different curves are shown which correspond to different extents of bleaching. In FIG. 16 100 percent, 70 percent, 50 percent and 30 percent refer to the fraction of the initial concentration of the photoluminescent material within the sample i.e. 100 percent means 0 percent of the luminescent material is bleached, 70 percent means 30 percent of the luminescent material is bleached et cetera. It can be seen that at a thickness of 10 micron before bleaching about 60 percent of the light is absorbed. After 70 percent bleaching of the photoluminescent material the absorption becomes about 20 percent. This corresponds to about 70 percent reduction in absorption. At a layer thickness of 50 micron, before bleaching the absorption is more than 95 percent. After a decrease of 70 percent in the concentration of converting photoluminescent material the absorption becomes 70 percent. This corresponds to a much lower decrease of 27.7 percent in absorption. In the case of a sample with a much higher thickness of 200 micron the absorption shows hardly any change and almost all the light is still absorbed when 70 percent of the photoluminescent material is bleached. In all cases, when primary light is absorbed, it is converted to secondary light. Thus, if the absorbance, which is preferentially defined as the product of the extinction coefficient, the thickness of the conversion layer and the concentration of the converting photoluminescent material within the conversion layer, is increased by increasing the thickness, it is possible to get to a situation that, when a high percentage of the luminescent material is degraded, there is a relatively small change in the absorption of primary light and thus in the emission of secondary light. With reference to FIG. 16 the thickness of the conversion layer is, for example, preferentially 50 micron or larger, further preferred 100 micron or larger, or even further preferred 200 micron or larger.

Figure 17:
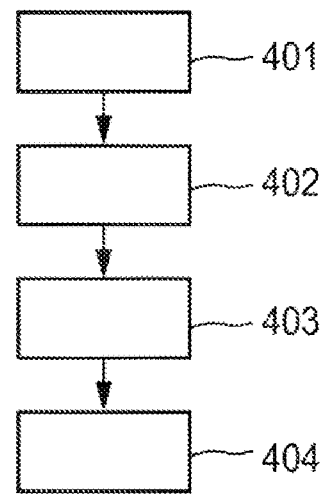
FIG. 17 shows a flowchart exemplarily illustrating an embodiment of a manufacturing method for manufacturing a lighting apparatus

In the following a manufacturing method for manufacturing a lighting apparatus will be described with reference to a flowchart shown in FIG. 17.

In step 401 a conversion material is provided for converting primary light into secondary light, wherein the conversion material comprises converting photoluminescent material which degrades over time under illumination and/or heat. In step 402, the conversion material is adapted such that, when the conversion material is illuminated by the primary light, the relative decrease in concentration of the converting photoluminescent material within the conversion material is larger than the relative decrease intensity of the secondary light. In step 403, a primary light source is provided for emitting primary light and in step 404 the conversion material and the primary light source are arranged such that primary light is directable to the converting photoluminescent material for generating secondary light. It should be noted that step 403 can also be performed before step 402.

Figure 18:
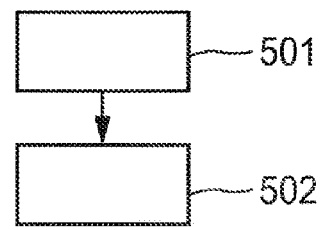
FIG. 18 shows a flowchart exemplarily illustrating an embodiment of a lighting method.

In the following a lighting method will be exemplarily described with reference to a flowchart shown in FIG. 18.

In step 501, primary light is emitted by a primary light source and in step 502 the primary light is directed to converting photoluminescent material, which degrades overtime, of a conversion material for generating secondary light, wherein the conversion material is adapted such that, when the conversion material is illuminated by the primary light, the relative decrease in concentration of the converting photoluminescent material within the conversion material is larger than the relative decrease intensity of the secondary light.

The converting photoluminescent material comprises preferentially organic phosphors and/or quantum dot phosphors. The lighting apparatus can be used in various applications such as horticulture, automotive lighting and in traffic lights. For this purpose a blue emitting light emitting diode can be used, wherein primary light originating from the blue light emitting diode is converted to secondary light having another color such as amber and red. In order to compensate for eventual bleaching of the organic phosphor, the thickness of the conversion layer and/or the concentration of the phosphor within the conversion layer are chosen accordingly such that, when the conversion material is illuminated by the primary light, the relative decrease in concentration of the converting photoluminescent material within the conversion material is larger than the relative decrease intensity of the secondary light. The lighting apparatus is preferentially adapted such that efficiency reductions due to self absorption of the phosphor are reduced.

Especially in automotive and traffic light applications, the lighting apparatus is preferentially adapted such that the luminescence of the phosphor caused by external light falling onto the phosphor is avoided. The amount of phosphor is preferentially chosen high enough such that blue light is substantially completely absorbed, even after a prolonged irradiation leading to a bleaching of a part of the phosphor molecules.

It should be noted that the figures of the embodiments of the lighting apparatuses are only schematic and exemplary figures. For example, in FIGS. 7 to 9 the collimator 218 can be adapted to allow the primary light to illuminate the complete left side of the conversion material in these figures, in particular, homogenously. Moreover, the primary light source 203 can be arranged such that in FIGS. 7 to 9 the left side of the conversion material 202 is illuminated more centrally.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage. The control of the lighting apparatus in accordance with the lighting method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a lighting apparatus comprising a conversion material for converting primary light into secondary light, wherein the conversion material comprises converting photoluminescent material, which degrades to non-converting photoluminescent material over time when the conversion material is illuminated by the primary light. The conversion material is adapted such that, when the conversion material is illuminated by the primary light, the relative decrease in concentration of the converting photoluminescent material within the conversion material is larger than the relative decrease in intensity of the secondary light. This allows the lighting apparatus to provide an only slightly reduced absorbance of the primary light, even if a large part of the photoluminescent material has been bleached, and thus a longer lifetime, with the same or a slightly reduced intensity of the secondary light.

The invention claimed is:

1. A lighting apparatus comprising:
    a conversion material for converting primary light into secondary light, wherein the conversion material comprises converting photoluminescent material which degrades to non-converting photoluminescent material over time when the conversion material is illuminated by the primary light,
    a primary light source for emitting the primary light for being directed to the conversion material for generating the secondary light,
    wherein the conversion material is adapted such that, when the conversion material is illuminated by the primary light, the relative decrease in concentration of the converting photoluminescent material within the conversion material is larger than the relative decrease in intensity of the secondary light.

2. The lighting apparatus as defined in claim 1, wherein the conversion material is adapted such that, when the relative decrease in concentration of the converting photoluminescent material is 90 percent, the relative decrease in intensity of the secondary light is smaller than 10 percent.

3. The lighting apparatus as defined in claim 1, wherein the converting photoluminescent material comprises an organic photoluminescent material and/or quantum dots.

4. The lighting apparatus as defined in claim 1, wherein the primary light source is a light emitting diode.

5. The lighting apparatus as defined in claim 1, wherein the conversion material comprises particles for scattering the secondary light for reducing waveguiding effects.

6. The lighting apparatus as defined in claim 1, wherein the conversion material forms a layer comprising a decoupling outer surface for coupling the secondary light out.

7. The lighting apparatus as defined in claim 1, wherein the conversion material forms a layer comprising a surface being optically coupled to a scattering surface for reducing waveguiding effects.

8. The lighting apparatus as defined in claim 1, wherein the conversion material forms a layer comprising an outer decoupling surface for decoupling the secondary light from the layer, wherein the primary light source and the layer are arranged such that the primary light illuminates the layer in a direction being transverse or parallel to the outer decoupling surface.

9. The lighting apparatus as defined in claim 1, wherein the lighting apparatus comprises a shield for shielding the converting photoluminescent material from environmental light.

10. The lighting apparatus as defined in claim 1, wherein the lighting apparatus comprises a reflective chamber comprising a reflective inner surface for directing the primary light to at least one of a photoluminescence region in which the conversion material is located or an exit window of the reflective chamber.

11. The lighting apparatus as defined in claim 1, wherein the converting photoluminescent material is arranged in a pattern.

12. The lighting apparatus as defined in claim 11, wherein the pattern comprises at least one first area with the converting photoluminescent material and at least one second area without the converting photoluminescent material.

13. The lighting apparatus as defined in claim 11, wherein the conversion material comprises a composite including two phases and wherein the converting photoluminescent material is present in one of the two phases only for arranging the converting photoluminescent material in the pattern.

14. A manufacturing method for manufacturing a lighting apparatus, the manufacturing method comprising:
    providing conversion material for converting primary light into secondary light, wherein the conversion material comprises converting photoluminescent material, which degrades to non-converting material over time when the conversion material is illuminated by the primary light,
    adapting the conversion material such that, when the conversion material is illuminated by the primary light, the relative decrease in concentration of the converting photoluminescent material within the conversion material is larger than the relative decrease in intensity of the secondary light,
    providing a primary light source for emitting the primary light,
    arranging the conversion material and the primary light source such that the primary light is directable to the conversion material for generating the secondary light.

15. A lighting method, wherein primary light is emitted by a primary light source and directed to conversion material comprising converting photoluminescent material, which degrades to non-converting photoluminescent material over time when the conversion material is illuminated by the primary light, for generating secondary light, wherein the conversion material is adapted such that, when the conversion material is illuminated by the primary light, the relative decrease in concentration of the converting photoluminescent material within the conversion material is larger than the relative decrease in intensity of the secondary light.

* * * * *